United States Patent
Ono

(10) Patent No.: US 6,246,429 B1
(45) Date of Patent: *Jun. 12, 2001

(54) LIGHT EMITTING DIODE SUBSTRATE AND ITS MANUFACTURING METHOD

(75) Inventor: Koichiro Ono, Tottori (JP)

(73) Assignee: Sanyo Electric Co., Ltd., Tottori-Ken (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/068,980
(22) PCT Filed: Sep. 22, 1997
(86) PCT No.: PCT/JP97/03376
  § 371 Date: May 22, 1998
  § 102(e) Date: May 22, 1998
(87) PCT Pub. No.: WO98/13207
  PCT Pub. Date: Apr. 2, 1998

(30) Foreign Application Priority Data

Sep. 26, 1996 (JP) .................................... 8-255062

(51) Int. Cl.[7] ........................................ B41J 2/45
(52) U.S. Cl. ............................... 347/238; 347/130
(58) Field of Search ................... 347/130, 225, 347/237, 238, 245; 257/88, 99; 29/592.1

(56) References Cited

U.S. PATENT DOCUMENTS

| | | | |
|---|---|---|---|
| 5,808,718 | * 9/1998 | Aikoh et al. | 347/130 |
| 5,870,128 | * 2/1999 | Yazawa et al. | 347/238 |
| 5,926,694 | * 7/1999 | Chigawa et al. | 438/106 |

FOREIGN PATENT DOCUMENTS 57-118077 7/1982 (JP).
5-323230 12/1993 (JP).

* cited by examiner

*Primary Examiner*—N. Le
*Assistant Examiner*—Lamson D. Nguyen
(74) *Attorney, Agent, or Firm*—Arent Fox Kintner Plotkin & Kahn, PLLC

(57) ABSTRACT

In a light-emitting diode array panel in which an array of light-emitting diode pellets having a light-emitting region are arranged substantially in a straight line on a long and narrow substrate made of resin along the length thereof and on one side of the width center thereof, the substrate is kept warped when the light-emitting diode pellets are arranged on the substrate. Alternatively, the light-emitting diode pellets are arranged in a curved line. This ensures that the array of light-emitting diode pellets forms a straight line after a heat-hardening process.

20 Claims, 8 Drawing Sheets

LIGHT EMITTING DIODE SUBSTRATE AND ITS MANUFACTURING METHOD

TECHNICAL FIELD

The present invention relates to an LED (light-emitting diode) array panel such as is used in an optical printer head or the like, and to a method of manufacturing such an LED array panel.

BACKGROUND ART

Conventionally, an LED array panel such as is used in an optical printer head or the like has been produced by arranging a plurality of pellets of LEDs (light-emitting diodes) in one line and a plurality of pellets of driving devices in another line both on a long and narrow substrate, as disclosed in Japanese Laid-Open Patent Application No. S60-72281. This is because, whereas it is impossible to produce a pellet that is longer than about 10 mm, an optical printer head is usually required to be longer than 200 mm. In addition, to obtain satisfactorily high print quality, the LED pellets need to be arranged in a straight line, and therefore it is customary to make the substrate of ceramic or other material that is resistant to deformation.

However, an optical printer that can print on a large sheet of paper such as an A0-size sheet requires a substrate that is about 1,100 mm long, and, if this substrate is made of ceramic, it will be unduly heavy. Using such a heavy substrate necessitates accordingly large supporting components, and thus ends in making the printer as a whole unduly large.

To overcome this problem, a method has been devised in which LED pellets are arranged on a light-weight substrate made of resin. FIGS. 1(a) and 1(b) show the structure of an LED array panel produced by such a method. FIG. 1(a) is a plan view of an LED array panel that uses a substrate made of resin, and FIG. 1(b) is a sectional view taken along line A—A of FIG. 1(a). The long and narrow substrate 1 of resin is a printed circuit board 1,100 mm long, 35 mm wide, and 0.6–1.5 mm thick. Its base 11 is made of glass-epoxy prepreg, a mixture of glass-epoxy prepreg and ceramic, paper-epoxy prepreg, or a similar material. The substrate 1 has printed patterns 12a to 12d that are formed on its base 11 by coppering, printing, metalizing, or a similar method. These patterns are preferably formed over as large an area as possible to increase the strength of the substrate 1, to ease the dissipation of heat from the LEDs formed in the LED pellets 2, and to reduce the effect of wiring resistance on the voltage of the electric power supplied to the LEDs. In fact, in this example, the printed patterns 12a and 12b, which are for the negative side (ground side) and the positive side, respectively, of the supplied power, are formed over as large an area as possible, and, in addition, the printed pattern 12d, which is for heat dissipation, is formed on the bottom surface of the substrate 1 as well. If necessary, a multilayer-wiring printed circuit board may be used as the substrate 1. The printed pattern 12c is for the connection of drivers (described later) for driving the LEDs.

Along the length of the substrate 1, pellets 2 of LEDs are arranged in a line, and pellets 3 of drivers for driving the LEDs are arranged in another line parallel thereto. These pellets are, with thermosetting adhesive 4 and 5, fixed to the substrate 1 on one side (the upper side in FIG. 1(a)) thereof with respect to the width center thereof. In this example, the dimension C in the figure is about 10 mm. One-sided placing of the pellets helps to reduce the width of the printer head. Each of the LED pellets 2 is formed as a so-called monolithic array; for example, it is 8 mm long and 0.6 mm wide, and has, on its top surface and along its length, a linear array of light-emitting regions 21 that provide a resolution of 500 dpi (dots per inch), with each light-emitting region provided with an individual electrode 22; in addition, it also has, on its bottom surface, a common electrode (not shown). A plurality of such LED pellets 2 are so arranged that their light-emitting regions 21 form a straight line that extends almost over the entire length of the substrate 1; these pellets are fixed to and thereby grounded to the substrate 1 with conducting thermosetting adhesive 4 such as silver paste that contains epoxy resin as its main ingredient.

On the other hand, the driver pellets 3, each having an integrated circuit built inside near its top surface, are arranged in a line approximately parallel to the LED pellets 2, and are fixed to the substrate 1 with non-conducting thermosetting adhesive 5 such as epoxy-resin-based adhesive. Each driver pellet 3 has one end connected to the individual electrode 22 of the corresponding LED pellet 2 with a fine wire-bonding wire 6, and has the other end connected to the printed pattern 12c for the connection of the driver pellets or to the printed pattern 12b for the positive side of the supplied power similarly with a fine wire-bonding wire 6.

The substrate 1 has through holes 13a and cuts 13b that allow it to be fixed to a head supporting member or heat sink.

However, actual production of an LED array panel 10 having a structure as described above proved that it has the following disadvantages.

FIG. 4 shows the results of an experiment in which 113 LED pellets 2 were arranged on a resin substrate 1 with thermosetting adhesive 4 by the use of an automatic bonding machine and then the adhesive was hardened with heat. In FIG. 4, the abscissa represents the position of the individual LED pellets 2, and the ordinate represents the deviation of the individual LED pellets 2 in the direction of the width of the substrate 1 from the line through the LED pellets 2 at both ends. In FIG. 4, the graphs (A) show the deviation observed when the substrate has just been removed from the automatic bonding machine, and these graphs are curved about 0.15 mm downward at their middle, assuming that the LED pellets 2 are arranged on the "upper" side of the substrate 1 with respect to the width center thereof. The graphs (B) show the deviation observed after the heat-hardening of the thermosetting adhesive 4, and these graphs are curved about 0.15 mm upward at their middle. The graphs (C) show the difference between the deviation before the heat-hardening and the deviation after the heat-hardening, and these graphs indicate that the heat-hardening of the thermosetting adhesive 4 results in shifting the curves a maximum of 0.25 mm upward at their middle.

The warping of the array of the LED pellets 2 before the heat-hardening can be reduced by adjusting the automatic bonding machine. The results of an experiment that was performed with the automatic bonding machine appropriately adjusted are shown in FIG. 3. In FIG. 3, as in FIG. 4, the abscissa represents the position of the individual LED pellets 2, and the ordinate represents the deviation of the individual LED pellets 2 in the direction of the width of the substrate 1 from the line through the LED pellets 2 at both ends. The graph (A) shows the deviation observed when the LED pellets 2 are arranged on the substrate 1 after the adjustment of the straightness of the automatic bonding machine, and this graph indicates that the deviation then falls within a range from −0.07 mm to +0.03 mm. However, after the heat-hardening, as the graph (B) shows, the deviation describes a curved line that. is curved about 0.2 mm upward at its middle. This change resulting from the heat-hardening is not due to the movement of the LED pellets 2 during the heat-hardening, but due to the fact that, as shown in FIG. 2, the substrate 1, which has a shape as indicated by broken lines before the heat-hardening, warps upward within its plane as indicated by solid lines after the heat-hardening. This warping results from the LED and driver pellets 2 and 3 being placed on one side (the upper side in FIG. 1(*a*)) of the substrate 1 with respect to the width center thereof, and it has been found that such warping cannot be avoided as long as the substrate is made of resin.

An object of the present invention is to provide an LED array panel in which LED pellets are arranged accurately in a straight line on a substrate made of resin.

Another object of the present invention is to provide a method of manufacturing an LED array panel in which LED pellets are arranged accurately in a straight line on a substrate made of resin.

DISCLOSURE OF THE INVENTION

According to the present invention, in an LED array panel in which an array of pellets having a light-emitting region are arranged on a long and narrow substrate made of resin, with the pellets arranged in a line along the length of the substrate on one side of the width center of the substrate by use of adhesive, the substrate is kept warped within a plane parallel thereto when the pellets are arranged on the substrate.

Alternatively, according to the present invention, in a similar LED array panel, the pellets are attached to the substrate by use of the adhesive, and the pellets are arranged in a straight line by a warp that develops in the substrate when the adhesive hardens.

Alternatively, according to the present invention, in a similar LED array panel, there are provided means for causing the substrate to develop a warp within a plane parallel thereto, means for arranging the pellets substantially in a straight line by use of the adhesive, and means for hardening the adhesive.

Alternatively, according to the present invention, in a similar LED array panel, there are provided means for arranging the pellets in a curved, V-shaped, or stepped line by use of the adhesive in such a way that a warp that develops in the substrate when the adhesive hardens is canceled and thereby the pellets are prevented from being arranged in a line that is not straight, and means for hardening the adhesive with heat.

BEST MODE FOR CARRYING OUT THE INVENTION

Figure 1A:
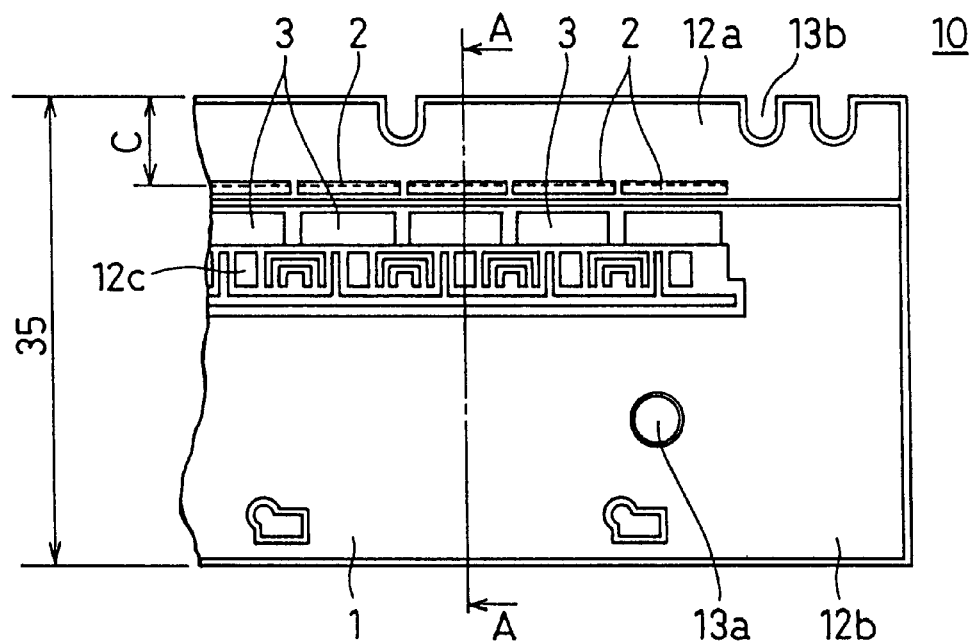
FIG. 1(*a*) is a plan view of an LED array panel embodying the present invention, illustrating the structure of its principal portion, and FIG. 1(*b*) is a sectional view taken along line A—A of FIG. 1(*a*).
Figure 1B:
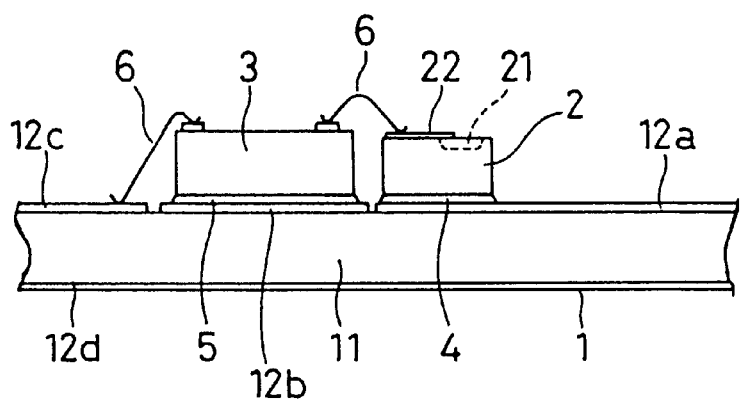
Figure 2:
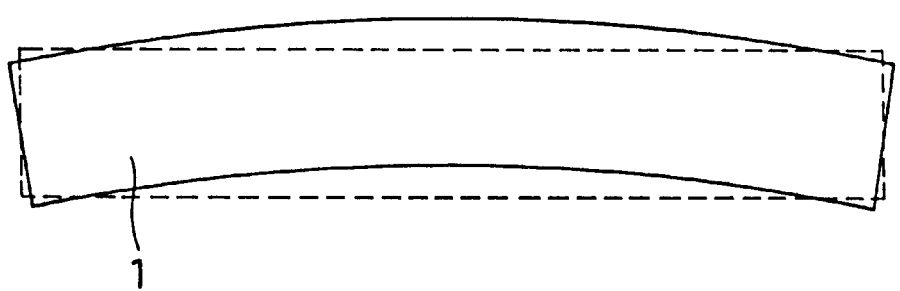
FIG. 2 is a diagram schematically illustrating the warping of a substrate made of resin.
Figure 5A:
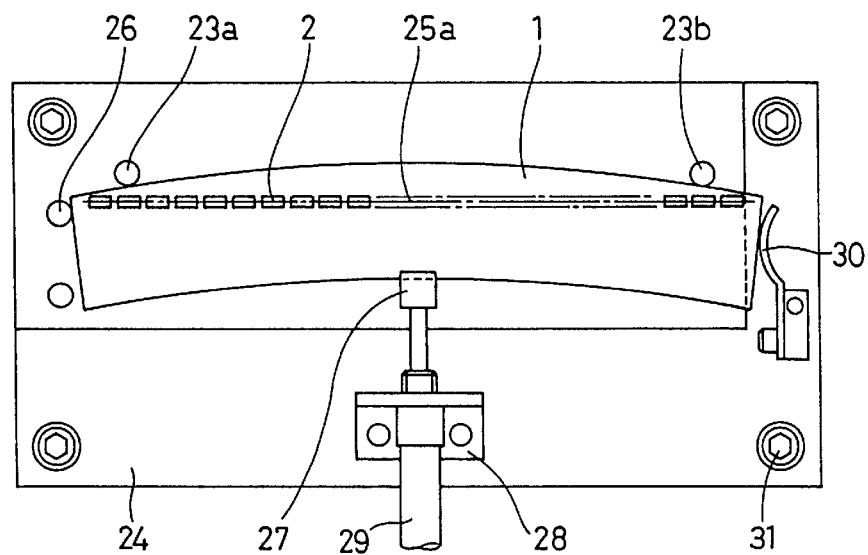
FIGS. 5(*a*), 5(*b*), and 5(*c*) are diagrams schematically illustrating the warping of substrate observed in the manufacturing process of a first embodiment of the present invention.
Figure 5B:
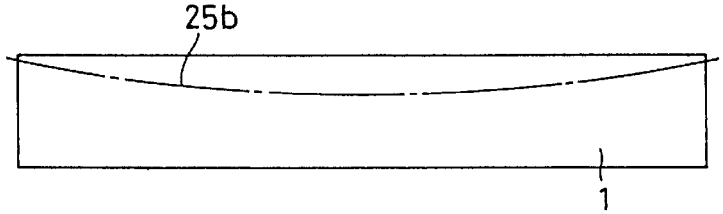

A first embodiment of the present invention will be described below, using as an example the previously described LED array panel 10 shown in FIGS. 1(*a*) and 1(*b*). FIGS. 5(*a*), 5(*b*), and 5(*c*) are diagrams schematically illustrating how the substrate 1 shown in FIG. 1(*a*) develops a warp during the manufacturing process of this embodiment. FIG. 5(*a*) illustrates an example of how the LED pellets 2 are fixed on the substrate 1 with adhesive on an automatic bonding machine. The automatic bonding machine has a board holding table 24 that is fixed thereon with bolts 31. On the board holding table 24 are arranged widthwise stoppers 23*a* and 23*b*, lengthwise stoppers 26, a flat spring 30, and an air cylinder 29 that is fixed on the table 24 through an air cylinder fixture 28. The air cylinder 29 is fitted with a pressing member 27 at the end of its rod. The substrate 1 is automatically transferred onto the board holding table 24, and is positioned lengthwise by the lengthwise stoppers 26 and the flat spring 30. Then, the air cylinder 29 is actuated so that the substrate 1 is positioned widthwise by the pressing member 27 and the widthwise stoppers 23*a* and 23*b*. The widthwise stoppers 23*a* and 23*b* support the substrate 1 near the lengthwise ends thereof, and the pressing member 27 supports the substrate 1 approximately at the lengthwise middle thereof. By adjusting the pressure that the air cylinder 29 exerts at this time, it is possible to control the degree to which the substrate 1 warps within its plane. In this embodiment, the substrate 1 is so positioned that it warps upward and symmetrically with respect to the length center thereof. The appropriate pressure depends on the type of the substrate 1 and the hardening properties of the thermosetting adhesive 4, and therefore it needs to be determined experimentally. Under these conditions, the LED pellets 2 are bonded to the substrate 1 with the thermosetting adhesive 4 along a straight line as indicated by the dash-and-dot line 25*a*. Next, the substrate 1 is removed from the automatic bonding machine. At this time, that is, before the hardening of the thermosetting adhesive 4, as shown in FIG. 5(*b*), the substrate 1 exhibits almost no warping, and the line along which the LED pellets 2 are arranged is curved downward as indicated by the dash-and-dot line 25*b*. After the heat-hardening of the thermosetting adhesive 4, as shown in FIG. 5(*c*), the substrate 1 develops an upward warp, and the line along which the LED pellets 2 are arranged becomes almost straight as indicated by the dash-and-dot line 25*c*.

In this way, by keeping the substrate 1 warped within its plane when the LED pellets 2 are arranged on the substrate 1, it is possible to obtain, after the heat-hardening of the thermosetting adhesive 4, an LED array panel in which the LED pellets 2 are arranged accurately in a straight line.

Figure 5C:
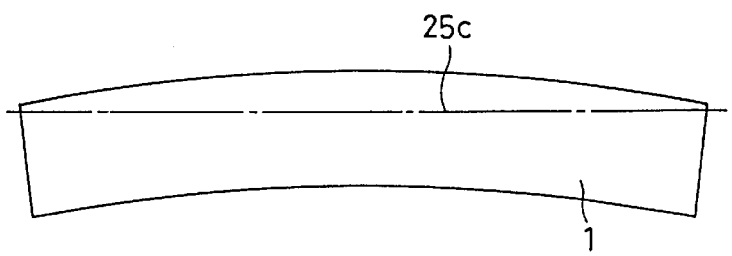
Figure 6:
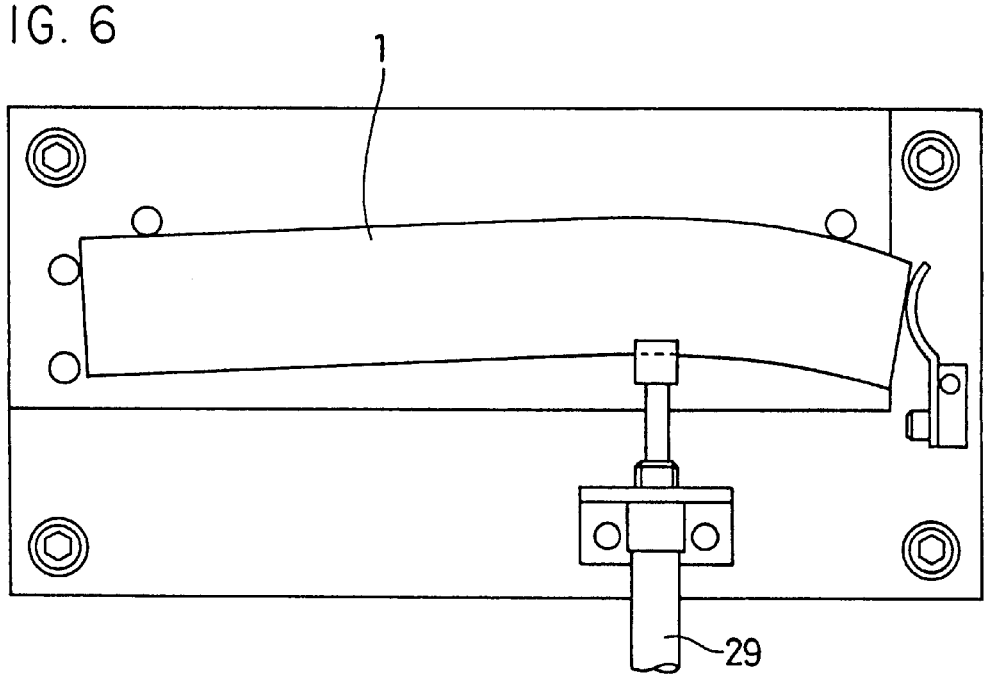
FIG. 6 is a plan view of a second embodiment of the present invention.

Next, a second embodiment of the present invention will be described below, with reference to FIG. 6. In FIG. 6, such elements as are common to FIG. 5 are identified with the same reference numerals. The warp that is caused by the heat-hardening is not always symmetrical with respect to the length center of the substrate 1, but, depending on the design of the LED array panel such as the shape of the substrate 1 and the positions of the LED pellets 2, on the hardening properties of the thermosetting adhesive 4, and on other factors, the warp often has its vertex in a position displaced from the length center of the substrate 1. In such a case, rather than applying pressure to the lengthwise middle of the substrate 1 as described above, the air cylinder 29 is moved so that the pressure will be applied to a different portion of the substrate 1. This makes it possible to warp the substrate 1 in such a way as to cancel the warp that it develops after the heat-hardening of the thermosetting adhesive 4.

Figure 3:
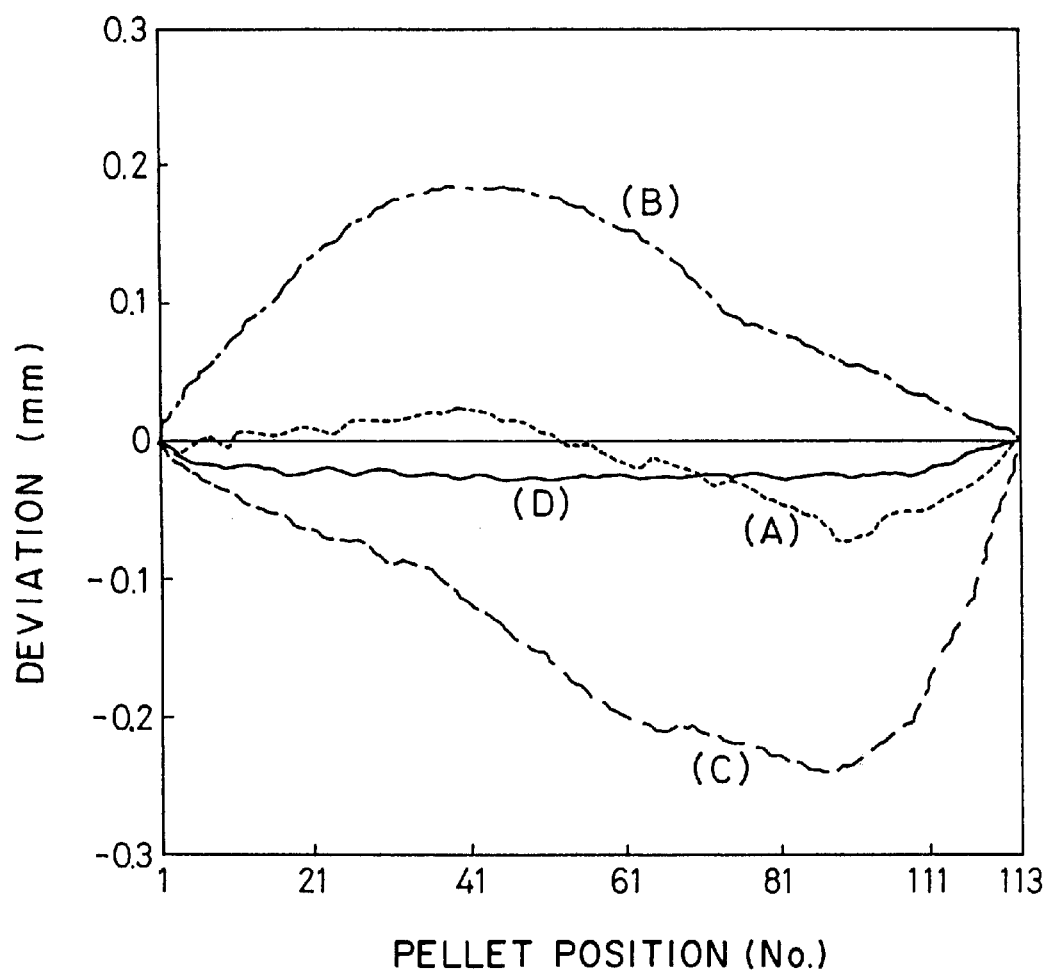
FIG. 3 is a diagram showing the straightness of the LED pellet array according to present invention, for comparison with the prior art.
Figure 4:
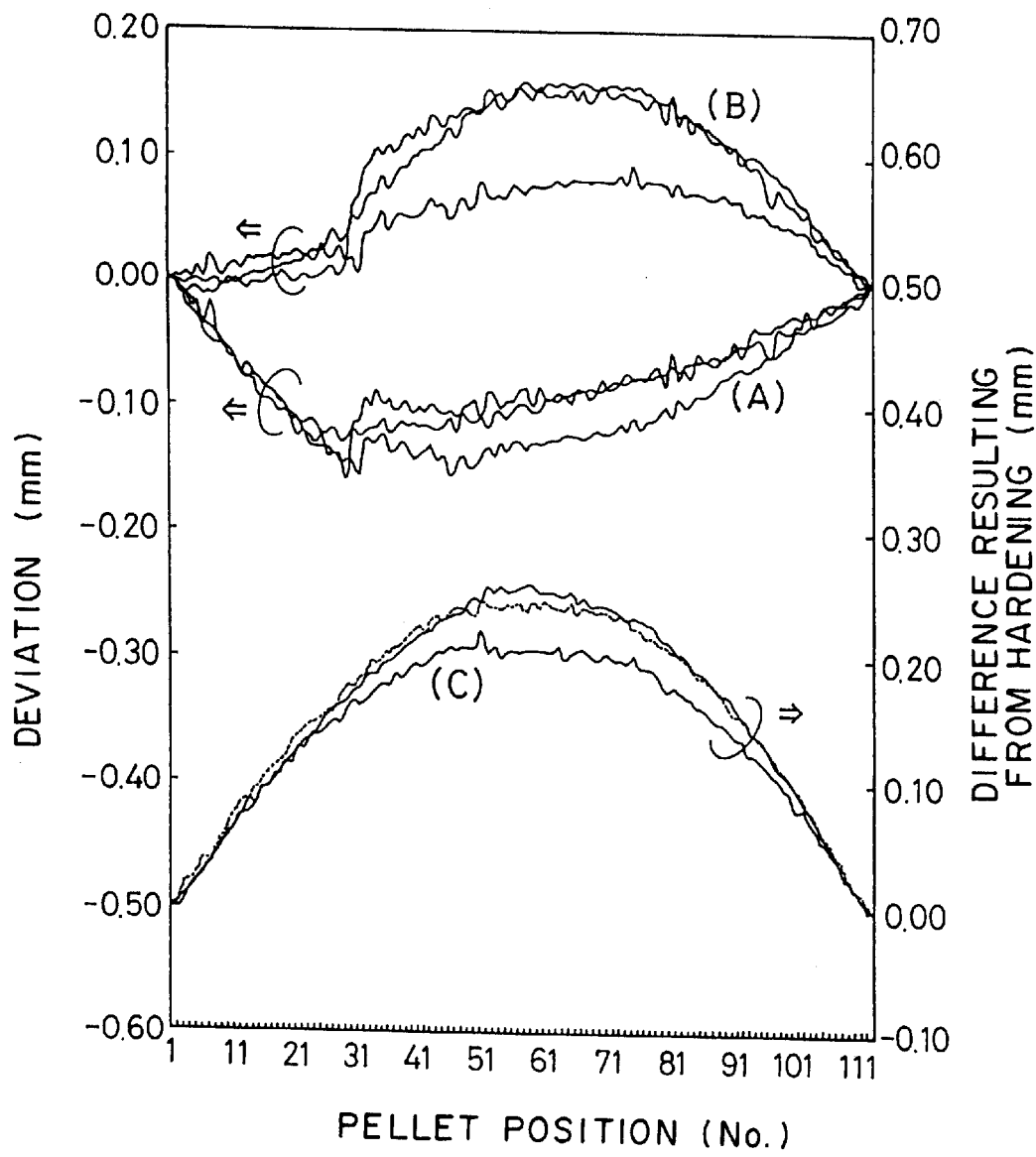
FIG. 4 is a diagram showing the straightness of the LED pellet array according to the prior art.

The results of an experiment in which the above was put into practice are shown in FIG. 3. In FIG. 3, the graph (C) shows the deviation of the LED pellets 2 as observed when the LED pellets 2 are bonded to the substrate 1 by use of an automatic bonding machine while pressure is applied to the substrate 1 in a position that is away lengthwise from one end of the substrate 1 by one sixth of the total length of the substrate 1 so that the substrate 1 is appropriately warped and then the substrate 1 is removed from the automatic bonding machine. After 120 minutes of hardening at 120° C., as the graph (D) shows, the array of the LED pellets forms a highly accurate straight line, with a maximum deviation of 0.03 mm.

Figure 7:
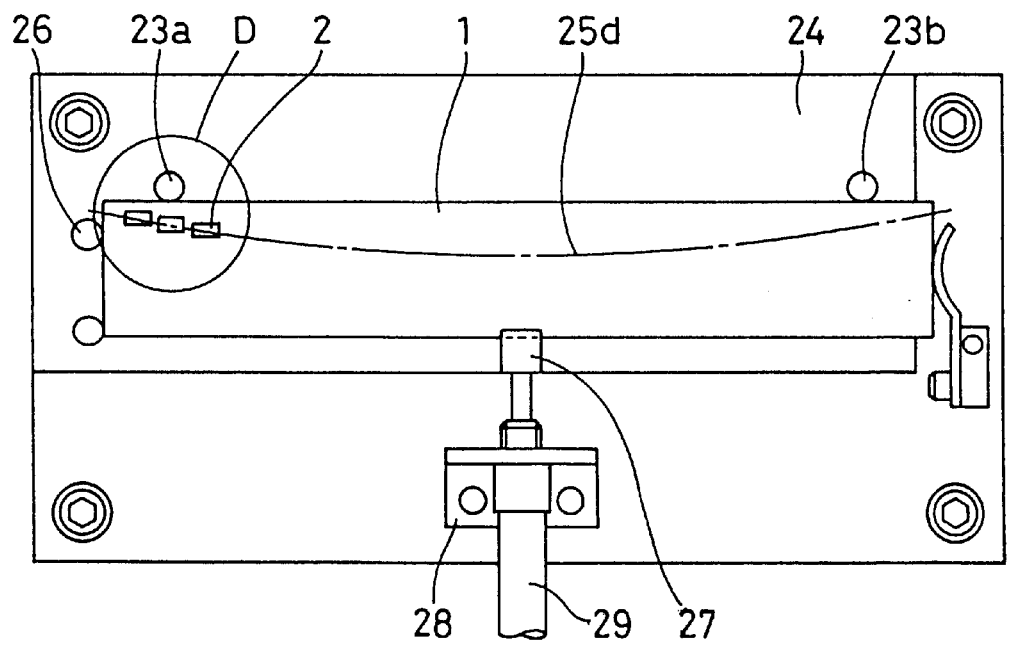
FIG. 7 is a plan view of a third embodiment of the present invention.

Next, a third embodiment of the present invention will be described below, with reference to FIG. 7. In FIG. 7, such elements as are common to FIG. 5 are identified with the same reference numerals. As shown in FIG. 7, after being transferred onto the board holding table 24 of the automatic bonding machine, the substrate 1 is positioned by being pressed against the lengthwise stoppers 26 and the widthwise stoppers 23a and 23b. The pressure that the air cylinder 29 exerts is set to a minimum that is required to position the substrate 1 without causing a warp therein. This is to prevent the substrate 1 from developing a warp when it is removed from the automatic bonding machine. Next, the LED pellets 2 are bonded to the substrate 1 with the thermosetting adhesive 4 along a curved line as indicated by the dash-and-dot line 25d, so that it is possible to obtain, after the heat-hardening of the thermosetting adhesive 4, an LED array panel in which the LED pellets 2 are arranged in a straight line, just in the same manner as shown in FIG. 5(c). As in the second embodiment, the curved line (the dash-and-dot line 25d) may have its vertex in a position displaced from the length center of the substrate 1.

Figure 8A:
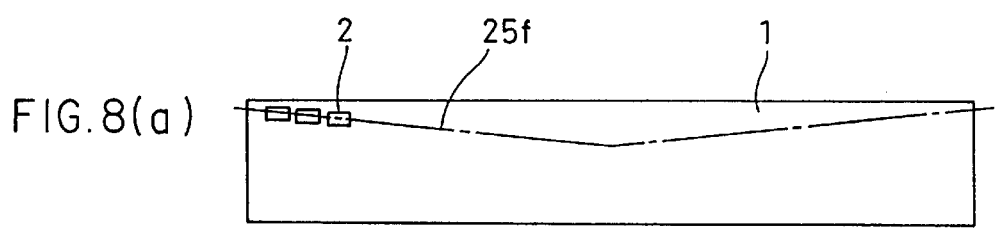
FIGS. 8(*a*) and 8(*b*) are diagrams schematically illustrating a fourth and a fifth embodiment of the present invention.
Figure 8B:
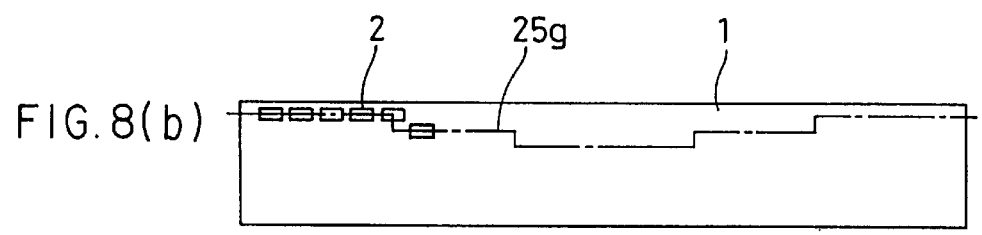

Curved arrangement of the LED pellets 2 is achieved by reversely using the straightness correction function that is usually provided in the automatic bonding machine; specifically, the LED pellets 2 can be arranged in a curved line by storing the deviation, as represented as two-dimensional coordinates, of each pellet from the ideal straight line. However, when there are a large number of LED pellets 2, storing the offset values for each position requires not only complicate setting of the equipment, but also memory capacity exceeding that of the equipment. Accordingly, in arranging the LED pellets 2 on the substrate 1, the offset values may be approximated by the use of a V-shaped line as indicated by the dash-and-dot line 25f in FIG. 8(a), or by the use of a stepped line as indicated by the dash-and-dot line 25g in FIG. 8(b).

Figure 9A:
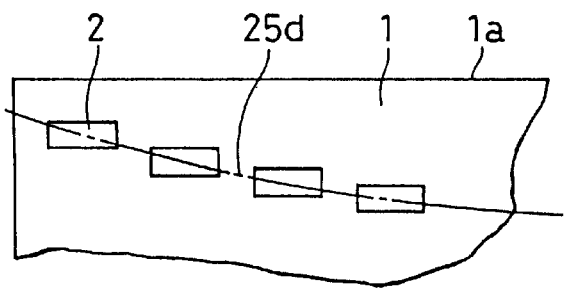
FIGS. 9(*a*), 9(*b*), and 9(*c*) are detail views illustrating the positions of LED pellets in the third embodiment.
Figure 9B:
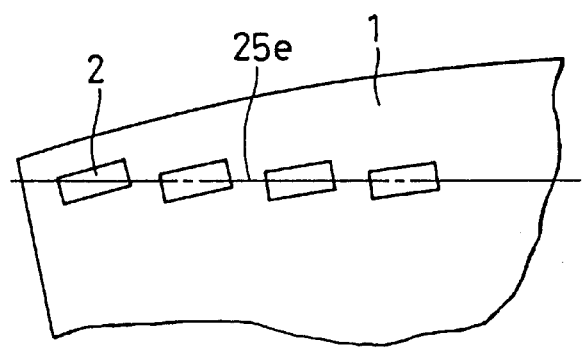
Figure 9C:
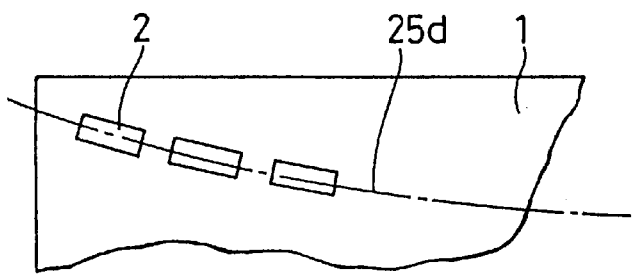

FIG. 9(a) shows a detailed view of the portion D, shown in FIG. 7, of the third embodiment. As shown in FIG. 9(a), the LED pellets 2 are, as the result of the two-dimensional offsetting, arranged along a curved line (the dash-and-dot line 25d), but each of them is placed parallel to the edge 1a of the substrate 1. After the heat-hardening, as shown in FIG. 9(b), the array of the LED pellets 2 forms a straight line (the dash-and-dot line 25e), but each of them is placed at an angle to the straight line (the dash-and-dot line 25e). The closer an LED pellet is to one of the lengthwise ends of the substrate 1, the larger angle it forms. Each LED pellet 2 has light-emitting regions (not shown) formed in a line along its length, and therefore placing an LED pellet at an angle means placing its light-emitting regions at an angle to the straight line (the dash-and-dot line 25e). This does not lead to any serious problem as long as the radius of curvature of the curved line (the dash-and-dot line 25d) is sufficiently large; however, when this radius of curvature is not so large, the light-emitting regions deviate so much from the straight line (the dash-and-dot line 25e) that the optical printer as an end product exhibits poor print quality. By contrast, as shown in FIG. 9(c), if, in addition to the two-dimensional offsetting of the positions of the LED pellets 2, their angles are also corrected in such a way that their light-emitting regions deviate less from the curved line (the dash-and-dot line 25d), it is possible to arrange the light-emitting regions of all LED pellets 2 in such a way that they form an almost straight line after the heat-hardening. In cases where such angle correction is too difficult to be processed by the equipment, it is also possible, as shown in FIG. 5(a) and described previously, to warp the substrate 1 to a certain degree when it is positioned on the board holding table 24 and then arrange the LED) pellets 2 in a curved line. This helps increase the radius of curvature of the curved line, and thus improve the straightness of the light-emitting regions. This applies also to cases where a V-shaped or stepped line is used.

In the first and second embodiments, warping the substrate 1 to such an extent that it has an excessively small radius of curvature may lead to problems such as breakage of a fine printed pattern, exfoliation of a wide printed pattern, or lifting-off of the substrate under higher pressure. In such cases, too, it is possible to reduce the degree of warping by previously warping the substrate 1 to a certain degree and then arranging the LED pellets 2 in a curved line.

INDUSTRIAL APPLICABILITY

As described heretofore, the LED array panel and the manufacturing method thereof according to the present invention are useful as an LED) array panel in which a plurality of LED pellets are arranged in a line on a resin substrate along the length thereof and on one side of the width center thereof by use of adhesive, and as a method of manufacturing such an LED array.

What is claimed is:

1. A light-emitting diode array panel comprising:
    a warped resin substrate elongated in a first direction;
    an array of pellets having a light emitting region arranged on a first surface of said warped substrate, said array of pellets arranged in a line along the first direction, wherein
    said pellets are attached by the process of (a) warping a substrate in the same plane as said first surface of said substrate and (b) attaching said pellets on said substrate with adhesive when said substrate is warped.

2. The light-emitting diode array panel of claim 1, wherein said array of pellets are arranged on the first surface of said substrate closer to one edge of the first surface.

3. The light-emitting diode array panel of claim 1, wherein said pellets are attached to the substrate by attaching said pellets on said substrate in a straight line when said substrate is forced into a warped position.

4. The light-emitting diode array panel of claim 3, wherein after attaching said pellets in a straight line when said substrate is warped, the substrate is released from the warped position and the substrate is again warped as a result of the adhesive hardening.

5. A light-emitting diode array panel comprising:

a warped resin substrate elongated in a first direction;

an array of pellets having a light emitting pattern arranged on a first surface of said warped substrate, said array of pellets arranged in a line along the first direction, wherein said pellets are attached by the process of (a) attaching said pellets on a substrate in a bent pattern by use of an adhesive, and (b) straightening the bent pattern by warping said substrate in the same plane as said first surface due to hardening of the adhesive.

6. The light-emitting diode array panel of claim 5, wherein said array of pellets are arranged on the first surface of said substrate closer to one edge of the first surface.

7. The light-emitting diode array panel of claim 5, wherein said pellets are elongated and said pellets are attached to the substrate by aligning each elongated pellet along a curved pattern.

8. The light-emitting diode array panel of claim 5, wherein a radius of curvature of warpage of the substrate lies in a plane parallel to the first surface of the substrate.

9. The light-emitting diode array panel of claim 5, wherein the bent pattern is one of a V-shape, a stepped shape or a curved line.

10. The light-emitting diode array panel of claim 5, wherein a radius of curvature of warpage of the substrate lies in a plane parallel to the first surface of the substrate.

11. A method of manufacturing a light-emitting diode array panel, the light-emitting diode array panel including a resin substrate elongated in a first direction, and an array of pellets having a light emitting region arranged on a first surface of said substrate, said array of pellets arranged in a line along the first direction, the method comprising:

(a) warping said substrate in the same plane as said first surface of said substrate; and (b) attaching said pellets on said substrate with adhesive when said substrate is warped.

12. The method of claim 11, wherein step (b) includes attaching said array of pellets on the first surface of said substrate closer to one edge of the first surface.

13. The method of claim 11, wherein step (b) includes attaching said pellets on said substrate in a straight line when said substrate is forced into a warped position.

14. The method of claim 13, further comprising:

after step (b), (c) releasing the substrate from the warped position, and (d) warping the substrate again warped by hardening the adhesive.

15. The method of claim 11, wherein step (a) includes warping the substrate in a direction parallel to the first surface.

16. A method of manufacturing a light-emitting diode array panel, the light-emitting diode array panel including a resin substrate elongated in a first direction, and an array of pellets having a light emitting region arranged on a first surface of said substrate, said array of pellets arranged in a line along the first direction, the method comprising:

(a) attaching said pellets on said substrate in a bent pattern by use of an adhesive, and (b) straightening the bent pattern by warping said substrate in the same plane as said first surface due to hardening of the adhesive.

17. The method of claim 16, wherein step (a) includes attaching said array of pellets on the first surface of said substrate closer to one edge of the first surface.

18. The method of claim 16, wherein said pellets are elongated and step (a) includes attaching said pellets to the substrate with each elongated pellet aligned along the bent pattern.

19. The method of claim 16, wherein step (a) includes warping the substrate in a direction parallel to the first surface.

20. The method of claim 16, wherein the bent pattern is one of a V-shape, a stepped shape or a curved line.

* * * * *